United States Patent [19]

Ocken et al.

[11] Patent Number: 4,872,089

[45] Date of Patent: Oct. 3, 1989

[54] HEAT SINK ASSEMBLY FOR DENSELY PACKED TRANSISTORS

[75] Inventors: Alfred G. Ocken, Franklin Park; Michael L. Charlier, Palatine; Raymond J. Kowieski, Mt. Prospect, all of Ill.

[73] Assignee: Motorola Inc., Schaumburg, Ill.

[21] Appl. No.: 286,001

[22] Filed: Dec. 19, 1988

[51] Int. Cl.[4] .............................................. H05K 7/20
[52] U.S. Cl. ................................... 361/388; 174/16.3; 357/81; 361/417
[58] Field of Search ................................. 361/417–420, 361/400, 403, 405, 386, 387, 388; 357/81; 165/80.2, 80.3, 185; 174/16.3

[56] References Cited

U.S. PATENT DOCUMENTS

| | | | |
|---|---|---|---|
| 4,667,270 | 5/1987 | Yagi | 361/417 |
| 4,674,005 | 6/1987 | Lacz | 174/16.3 |
| 4,710,852 | 12/1987 | Keen | 174/16.3 |
| 4,803,545 | 2/1989 | Birkle | 174/16.3 |
| 4,821,152 | 4/1989 | Lorenzen | 361/417 |

Primary Examiner—Gerald P. Tolin
Attorney, Agent, or Firm—John H. Moore

[57] ABSTRACT

A heat sink assembly for a plurality of transistors includes specially-formed spring clips and a specially-formed heat sink to hold the transistors firmly on the heat sink, and a lead protector that mates with the heat sink to receive and protect the leads of the transistors during handling. The lead protector and the heat sink include integrally-formed fastener/alignment pins for aligning the lead protector with the heat sink, and for aligning the completed heat sink assembly with a circuit board and for holding the assembly securely fastened to the circuit board. A particular feature of the lead protector permits it to mate with heat sink in a first discrete position in which it receives and protects the transistor leads, and to more closely mate with the heat sink in a second discrete position in which the transistor leads pass through the lead protector and into target holes in the circuit board.

18 Claims, 2 Drawing Sheets

HEAT SINK ASSEMBLY FOR DENSELY PACKED TRANSISTORS

FIELD OF THE INVENTION

This invention pertains to heat sinks, and particularly to heat sinks on which multiple transistors may be mounted.

BACKGROUND OF THE INVENTION

Heat sinks of the type considered herein are typically made of a metal, such as aluminum. Each of one or more transistors may be mounted on the heat sink by means of a spring clip which holds the transistor snugly against the heat sink. A typical arrangement is shown in FIG. 1.

The illustrated heat sink assembly includes an aluminum heat sink 10, a transistor 12, and a spring clip 14 that holds the transistor 12 against one wall of the heat sink 10. One end 16 of the spring clip is curved upwardly to form a grip which permits the clip to be opened to insert the transistor between the spring clip and the heat sink. The other end (not shown) of the spring clip 14 passes through an aperture 18 in the heat sink. Additional apertures 20, 22 are included to receive other spring clips so that a plurality of transistors may be mounted on the same heat sink 10.

The heat sink 10, along with the transistors and spring clips mounted thereon, are usually mounted on a printed circuit board 24. As shown, the board 24 has holes 26 through which the leads of the transistor 12 are to be inserted. Another hole 28 permits a screw 30 to pass through the board 24 and into the heat sink 10 for securely holding the heat sink to the board 24.

Although the heat sink assembly of FIG. 1 and others like it work reasonably well, they do have certain drawbacks. For example, it is desirable to more easily mate the spring clips to the heat sink. It is also desirable to be able to more densely mount a number of transistors on their common heat sink so that less space is required for heat sinking a given number of transistors. In addition, it is desirable to be able to mount a heat sink assembly on a printed circuit board (or on a different type of carrier) without the use of screws, bolts or the like. Factory assembly would be more efficient without the use of such extra fasteners.

Another drawback of conventional heat sink assemblies is that they do not adequately protect the leads of the mounted transistors during handling. With the arrangement of FIG. 1, for example, the leads of the transistor may become inadvertently bent, or otherwise misaligned with the holes 26, prior to fastening the heat sink assembly to the board 24. As more transistors are added to the heat sink 10, this problem becomes more acute.

OBJECTS OF THE INVENTION

It is a general object of the invention to provide an improved heat sink assembly.

It is a more specific object of the invention to provide a heat sink assembly which is capable of holding a plurality of transistors that are relatively densely packed together, while also protecting the leads of the transistors from inadvertent bending.

It is another object of the invention to provide a heat sink assembly that is adapted to be mounted on a printed circuit board (or on another type of carrier) without the use of separate screws, bolts, or the like, and wherein the alignment of the transistor leads with corresponding holes in the printed circuit board, is greatly facilitated.

BRIEF DESCRIPTION OF THE FIGURES

FIG. 1, described previously, shows a conventional heat sink assembly and printed circuit board on which the assembly is to be mounted;

FIG. 3 is a partial view of the bottom of the heat sink shown in FIG. 2;

DESCRIPTION OF THE PREFERRED EMBODIMENT

Figure 2:
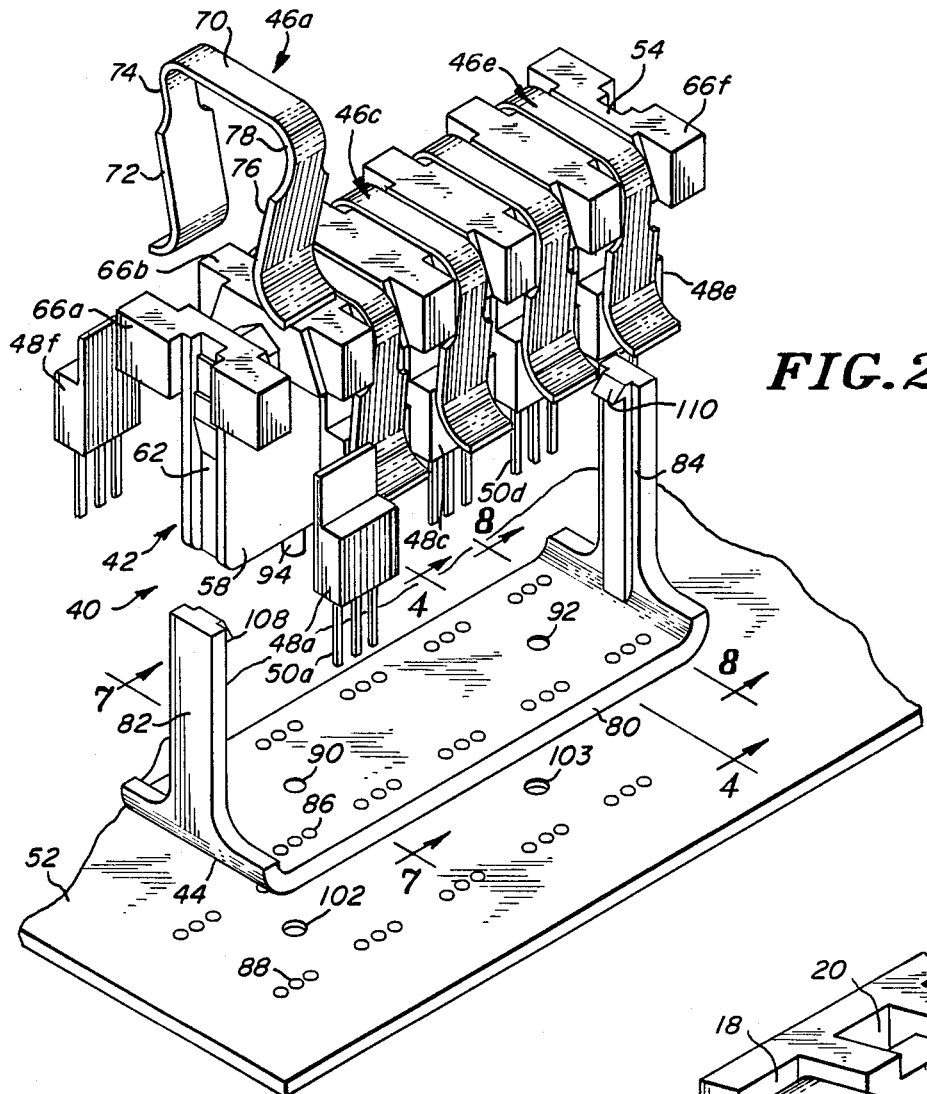
FIG. 2 is an exploded perspective view of a heat sink assembly according to the invention, plus a printed circuit board on which the heat sink assembly may be mounted.

Referring now to FIG. 2, an exploded view is shown of a preferred embodiment of a heat sink assembly 40 according to the invention. The illustrated assembly includes a metal heat sink 42, a lead protector 44, and a plurality of spring clips 44a-46e. Generally, the heat sink 42 is adapted to receive a plurality of transistors 48a-48j which are held in place by the spring clips 46a, 46b, etc. As will be discussed below, the heat sink 42 and the spring clips 46 are specially modified per one aspect of the invention to facilitate mating the spring clips with the heat sink 42.

Another aspect of the invention permits the leads 50 of the transistors to be protected during handling and also permits the leads 50 to be easily inserted into a circuit board 52 on which the assembly 40 may be mounted.

Turning again to the heat sink 42 (see FIGS. 2, 3 and 5), it includes a top 54, a bottom 56, side walls 58 and 60, and end walls 62 and 64. In this embodiment, the side wall 58 is identical to the side wall 60, and the end wall 62 is identical to the end wall 64.

The side wall 58 is shown as having 5 transistors mounted thereto, each at a different site, and the opposite side wall 60 also has 5 transistors mounted on it at similar sites. Thus, this embodiment of the invention is capable of holding 10 transistors in a relatively small space because both of the side walls 58, 60 are capable of holding transistors and the transistors are mounted relatively close to one another. In practice, one may choose to enlarge or reduce the size of the heat sink to hold more or less transistors, or one may elect to mount transistors on only one of the side walls. In any case, this invention permits tight packing of transistors while yet making it relatively easy to insert all the transistor leads 50 into the printed circuit board 52 without bending the leads, as will be explained more fully below.

To facilitate mating the spring clips with the heat sink 42, a pair of spaced-apart ramp surfaces are formed above each transistor site (a "site" refers to the specific location on a side wall where a transistor is to be mounted and held by a spring clip) on at least one, and preferably both, of the side walls. These ramp surfaces spread apart the legs of a spring clip that is being mated with the heat sink.

Figure 5:
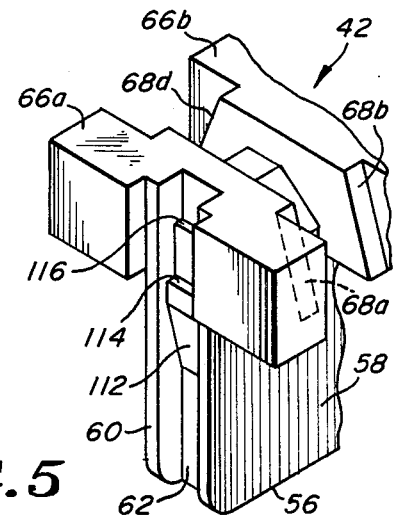
FIG. 5 is a perspective, partial view of one end of the heat sink shown in FIG. 2.

As best shown in FIGS. 2 and 5, the top 54 of the heat sink includes a plurality of spaced-apart beams 66a, 66b, etc. On an inside face of the beam 66b, a ramp surface 68b (FIG. 5) is formed. On the opposing inside face of the beam 66a, another identical ramp surface 68a is formed. As shown, both of these ramp surfaces extend downwardly and outwardly from the top of the heat sink. The space between the adjacent ramp surfaces 68a and 68b is referred to herein as a "clip space". On the opposite side wall 60, additional ramp surfaces, such as 68d (FIG. 5) are also formed. Additional pairs of similar ramp surfaces are formed on both sides of the heat sink between the beams 66a, 66b, etc.

The construction of the spring clips will now be discussed with reference to the spring clip 46a as shown in FIG. 2. In this embodiment, the spring clip 46a is substantially U-shaped. A horizontal member 70 attaches to integrally-formed, downwardly extending legs. One of the illustrated legs includes a lower portion 72 that is relatively wide. Joined to the lower portion 72 is an upper portion 74 that is relatively narrow. The spring clip is made of spring steel to render the legs of the spring clip resilient, i.e., the legs can be spread apart and, when released, will spring back to their original position.

The other leg of the spring clip 46a also has a relatively wide lower portion 76 joined to a relatively narrow upper portion 78. The width of the lower leg portion 76 is selected such that it bears on the adjacent ramp surfaces 68a and 68b (FIG. 5) when it is being mated with the heat sink.

The upper portion 78 has a width that is selected to be narrower than the distance between the adjacent ramp surfaces 68a, 68b. The upper and lower portions 74, 72 of the other leg are similarly dimensioned. Thus, while the transistor 48a (FIG. 2) is held in place at its designated site on the side wall 58 (by a conventional jig or the like), the spring clip 46a is urged downwardly from its illustrated position so that its legs enter the clip spaces between the beams 68a and 68b. The lower portion 76 of one leg of the spring clip will bear on the ramp surfaces 68a and 68b, while the lower portion 72 of the other leg bears on an identical pair of ramp surfaces (see, for example, ramp surface 68d in FIG. 5) on the opposite side of the heat sink. The interaction between those ramp surfaces and the lower portions of the legs causes the legs of the spring clip 46a to spread apart. As the spring clip descends further, its legs become spread apart sufficiently for them to ride over the transistors 48a and 48f. Further downward movement of the spring clip 46a causes the lower leg portions 72 and 76 to move below, and disengage from, the ramp surfaces 68a and 68b (and from the ramp surfaces on the opposite side of the heat sink). The relatively narrow upper portions 74 and 78 are not wide enough to engage the same ramp surfaces. Consequently, the legs of the spring clip 46a snap back to their original position to firmly hold the transistors 48a and 48f against the side walls 58 and 60, respectively.

The other spring clips are preferably constructed identically to the spring clip 46a and are engaged and disengaged with corresponding ramp surfaces in the manner just described.

With the transistors mounted on the heat sink as shown in FIG. 2, the transistor leads would, without additional protection, be susceptible to inadvertent bending during handling of the heat sink. To protect the leads of the transistors, the lead protector 44 is included. This lead protector includes a base member 80 and a pair of upwardly extending arms 82, 84. In general, the arms 82, 84 engage the end walls 62, 64 of the heat sink to attach the lead protector 44 to the heat sink. The base member 80 has groups of lead holes, such as holes 86, formed all the way through the base member. Each group of lead holes is positioned such that, when the lead protector 44 is attached to the heat sink 42, the base member 80 is close to the bottom of the heat sink and the leads of the transistors (such as leads 50a) are received by the lead holes (such as by holes 86). Further, the heat sink 42 and the lead protector 44 are constructed such that the lead protector 44 may be attached to the heat sink in a first position in which the base member 80 is close enough to the bottom of the heat sink to permit the transistor leads to be received by the lead holes 86 in the base member 80, but not close enough to permit the transistor leads to substantially extend through and below the base member 80. Thus, with the transistor leads substantially captured and protected by the base member 80, the heat sink assembly may be handled without inadvertently bending the leads of the transistors.

When it is time to mate the heat sink assembly with the circuit board 52, the heat sink assembly is aligned with the circuit board, pressed down on it, and the lead protector is urged into a second discrete position in which the base member 80 is urged into closer proximity to the bottom of the heat sink. This allows the transistor leads (such as leads 50) to extend further through the lead holes in the base member and to engage lead holes 88 in the circuit board 52. As shown, the circuit board 52 has a pattern of lead holes that matches the lead holes 86 in the base member so that each transistor lead becomes inserted into a lead hole in the circuit board 52.

Before describing the mechanism that permits the lead protector 44 to be situated at two discrete positions relative to the heat sink, it should be noted that the base member 80 also includes a pair of alignment holes 90 and 92. These holes receive a pair of alignment pins 94 and 96 that, as best shown in FIG. 3, extend downwardly from the bottom 56 of the heat 42. Not only do the pins 94, 96 help to properly align the heat sink with the lead protector 44, they also participate in fastening the entire heat sink assembly to the circuit board 52.

Figure 7:
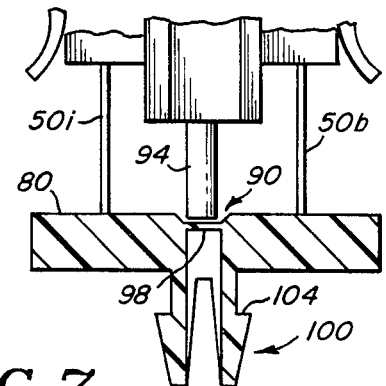
FIG. 7 is a cross-sectional view of the heat sink assembly taken along section lines 7—7 in FIG. 2, also illustrating the assembly in a partially closed condition.

The base member 80 also includes means for inhibiting the base member from inadvertently moving from its first position (wherein the transistor leads are captured by the lead holes 86 but do not extend below the base member) to its second position (wherein the transistor leads extend below the base member and into the lead holes 88 in the circuit bond 52). The mechanism for accomplishing this can best be seen in FIG. 7. As shown, the alignment hole 90 in the base member 80 is not a throughhole, at least not initially. Disposed inside the hole 90 is a thin membrane 98 that acts as a stop for the alignment pin 94. It can also be seen that, with the pin 94 resting on the membrane 98, transistor leads 50b and 50i are received in lead holes (not shown in FIG. 7) in the base member 80, but the received transistor leads do not extend below the base member 80. This illustrates the first discrete position of the lead protector. The base member's other alignment hole 92 (FIG. 2) is identical to the hole 90 and includes an identical membrane which stops the other alignment pin 96 (FIG. 3) until additional downward pressure is exerted on the heat sink to penetrate the membrane.

It can also be seen that the base member 80 carries a circular foot 100 that extends downwardly from the base member. The purpose of the foot 100 is to enter a fastening hole 102 (FIG. 2) in the circuit board 52. The foot 100 is constructed so that it is at least partially hollow and its interior communicates directly with the hole 90. With this arrangement, downward pressure on the heat sink causes the pin 94 to rupture the membrane 98 and enter the hollow foot 100, spreading the foot 100 outwardly so that a circular flange 104 formed on the foot 100 will tightly grip the bottom side of the circuit board 52. The heat sink assembly will then be securely fastened to the circuit board 52 without the need for additional fasteners.

Figure 4:
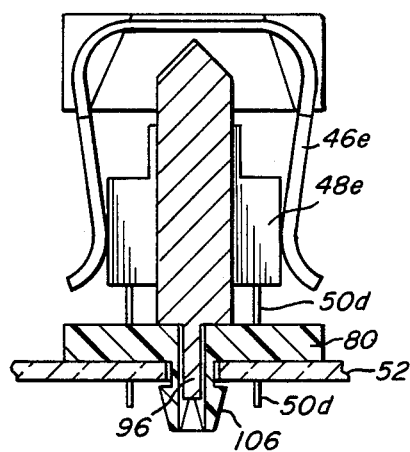
FIG. 4 is a cross sectional view of the heat sink assembly taken along section lines 4—4 in FIG. 2 showing the heat sink assembly in a fully-closed position and mated with the printed circuit board.

FIG. 4 illustrates the position of the other alignment pin 96 after it has penetrated a membrane within the hole 92. The pin 96 has gone through the hole 92 to the interior of another foot 106 which is shown gripping the underside of the circuit board 52. This condition is the above-described second position of the lead protector in which all the transistor leads, such as leads 50d in FIG. 4, completely penetrate the base member 80 and extend into the lead holes in the circuit board 52.

The mechanism by which the lead protector is attached to the heat sink and permitted to assume its first and second positions will now be described with reference to FIGS. 2 and 5. In FIG. 2, the arms 82 and 84, along with the base member 80, are formed as a single unit from a plastic material which allows the arms 82 and 84 to flex outwardly. A wedge-shaped protrusion 108 is carried near the top of the arm 82, and this protrusion faces inwardly toward a similar protrusion 110 carried by the other arm 84.

Referring now to the end wall 62 of the heat sink, it can be seen that a channel is formed therein by the side walls 58 and 60, best shown in FIG. 5. Within this channel, a first ramp surface 112 is formed, and above this ramp surface is a first ledge 114. Above the first ledge is second ledge 116.

The other end wall 64 includes similar or a identical first and second ledges and a ramped surface corresponding to the ramp surface 112.

Figure 6:
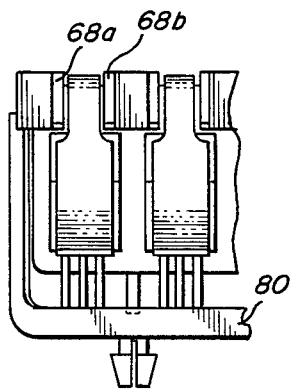
FIG. 6 is a plan, partial view of the heat sink assembly, illustrating the assembly in a partially closed condition.

To attach the lead protector 44 to the heat sink, the arms 82 and 84 are inserted into the channels formed by the side walls 58 and 60 and the base member 80 is moved upwardly so that the alignment pins 94 and 96 (FIG. 3) engage the holes 90 and 92 in the base member. As the base member moves upwardly, the arms 82 and 84 meet the ramp surfaces (ramp surface 112 in FIG. 5), whereupon the ramp surfaces gradually push the legs 82 and 84 apart until the protrusion 108 carried by the arm 82 meets the first ledge 114, and the other protrusion 110 meets its corresponding first ledge. At that point, the protrusions 108 and 110 snap back toward the heat sink with an audible "click", indicating to the person who may be manually attaching the lead protector to the heat sink that the lead protector has reached its first position. In this first position, all the transistor leads have been received by the lead holes (86, e.g.) in the base member, but the transistor leads preferably do not extend beyond the bottom of the base member. FIG. 6 shows the base member 80 in this first position, as does FIG. 7 which also shows how the membrane 98 acts as a stop for the alignment pin 94. This prevents the base member 80 from inadvertently moving beyond the first position.

Figure 8:
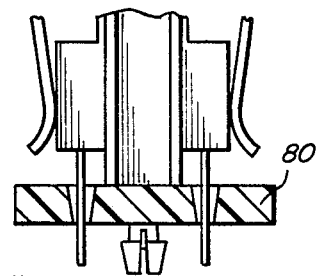
FIG. 8 is a cross-sectional view taken along section lines 8—8 in FIG. 2, illustrating the heat sink assembly a fully closed condition.
Figure 9:
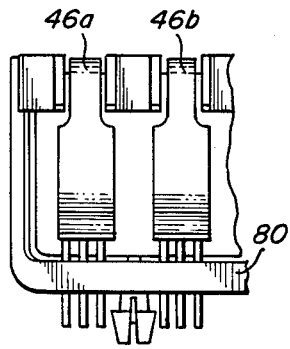
FIG. 9 is a plan, partial view of the heat sink assembly of FIG. 2 showing the assembly in a fully closed condition.

When the heat sink assembly is ready to be attached to the circuit board 52 (FIG. 2), the feet 100 and 106 that are carried on the bottom of the base member 80 (see also FIGS. 4 and 7) are aligned with the fastening holes 102 and 103 in the circuit board 52. The application of downward pressure on the heat sink assembly causes the alignment pins 94 and 96 to break through the membranes that are within the holes 90 and 92 in the base member 80. This causes two things to happen. First, the base member is moved closer to the bottom of the heat sink and the protrusions 108 and 110 move toward the second ledges (see ledge 116 in FIG. 5) where they again seat with another audible "click". This second position of the base member 80 is shown in FIGS. 8 and 9 in which the circuit board 52 has been omitted. Note that the transistor leads extend completely through the base member 80 and that the lead holes in the base member 80 are preferably tapered (as shown in FIG. 8) to facilitate entry of the transistor leads. As shown in FIG. 4, the transistor leads extend into the circuit board 52 where they are received by the lead holes 88.

The second event which happens is that the alignment pins 94, 96 enter into the feet 100 (FIG. 7) and 106 (FIG. 4), expanding both feet in order to firmly grip the circuit board 52 as shown in FIG. 4.

As a result of the foregoing, the heat sink 42, the lead protector 44 and the circuit board 52 are held together as a completed assembly. No additional fasteners are required.

Another advantage of this invention is that the spring clips 46a–46e are relatively easy to mate with the heat sink, and they are held securely fastened to the heat sink until removal is desired. Their legs must be deliberately spread apart until their lower portions (such as 72, 74) are clear of the ramp surfaces (such as 68a and 68b) before they can be removed.

Another significant advantage of this invention is that the leads of the transistors remain protected by the lead protector 52 while the latter device is in its first position. Accordingly, the heat sink assembly may be handled and/or stored without fear of bending the leads until it is time to attach the heat sink assembly to a circuit board or to another suitable device.

Further, the invention permits ten or more (or less) transistors to be densely packed on a single heat sink, and yet the leads of all the transistors are easily inserted into the circuit board, because the lead protector helps guide the transistor leads into the target holes in the circuit board.

Although the invention has been described in terms of a specific preferred embodiment, it will be obvious to those skilled in the art that various alterations and modifications may be made without departing from the invention. Accordingly, it is intended that all such alterations and modifications be considered as within the spirit and scope of the invention defined by the appended claims.

What is claimed is:

1. A heat sink assembly for a plurality of transistors, comprising;
   a metal heat sink having a top, a bottom, and side walls, at least one of the side walls being adapted to receive a plurality of transistors, each transistor being situated at a predetermined transistor site on the side wall;
   a plurality of spaced-apart ramp surfaces carried by the heat sink and situated near the top thereof, each ramp surface extending downwardly and outwardly from the top of the heat sink, the space between adjacent ramp surfaces defining a clip space, and each clip space being located above a transistor site;
   a resilient spring clip for each clip space, each spring clip being substantially U-shaped and comprising a horizontal member joined to a pair of downwardly extending legs, at least one leg of each spring clip having a relatively narrow portion close to its horizontal member and a relatively wider portion at its opposite end, the dimensions of the legs being selected such that, as a clip is inserted into a clip space, the wider portion of its one leg bears on a pair of adjacent ramp surfaces, and the same leg is spread outwardly by the ramp surfaces as the spring clip is urged downwardly until the relatively wider portion of said leg disengages from the previously engaged ramp surfaces, whereupon the leg snaps back to hold a transistor in place against a side wall.

2. A heat sink assembly as set forth in claim 1 further including a lead protector that has a base member with lead holes therein to receive leads from the transistors, the lead protector also having means for attachment to the heat sink such that, when the lead protector is attached to the heat sink, the transistor leads are received by the lead holes in the base member.

3. A heat sink assembly as set forth in claim 2 for attachment to a circuit board having at least one hole therein, wherein the base member carries a downwardly extending, expandable foot that is at least partially hollow and that mates with the hole in the circuit board to attach the base member to the circuit board, and wherein the heat sink includes a pin extending from the bottom thereof such that, when the lead protector is attached to the heat sink, the pin extends into the foot and expands it to more securely attach it to the circuit board.

4. A heat sink assembly as set forth in claim 2 wherein said means for attachment includes a pair of arms extending upwardly from opposite ends of the base member, each arm carrying a protrusion that extends toward the other arm, and the heat sink having end walls that carry means for receiving said protrusions.

5. A heat sink assembly as set forth in claim 4 wherein the arms of the lead protector are flexible, and wherein the receiving means carried by each end wall of the heat sink comprises:
   a ramp portion on which a protrusion bears as the lead protector is mated with the heat sink, the ramp portion urging the protrusion outwardly away from the heat sink as the lead protector's base member is urged upwardly toward the bottom of the heat sink, the ramp portion terminating in a first ledge so that the protrusion seats on the ledge when it reaches the end of the ramp, thereby releasably holding the lead protector to the heat sink in a first position relative to the heat sink.

6. A heat sink assembly as set forth in claim 5 wherein each side wall of the heat sink also includes a second ledge situated above the first ledge, so that further upward movement of the lead protector moves the protrusions upwardly to seat on the second ledge, thereby positioning the lead protector at a second position relative to the heat sink.

7. A heat sink assembly as set forth in claim 6 wherein the bottom of the heat sink includes at least one downwardly extending pin, wherein the lead protector's base member includes an aperture to receive said pin, and wherein the aperture is at least partially blocked by a membrane such that the pin only partly penetrates the aperture and rests on the membrane when the lead protector is in the first position relative to the heat sink, and whereby pressure causing the pin to penetrate the membrane permits the lead protector to move to the second position relative to the heat sink.

8. A heat sink assembly as set forth in claim 2 wherein the lead protector's attachment means and the heat sink are adapted to: (1) hold the lead protector's base member at a first position relative to the bottom of the heat sink, in which first position the transistor leads do not pass through the apertures in the base member, and (2) permit movement of the base member to a second position closer to the bottom of the heat sink, in which second position the transistor leads pass through the apertures.

9. A heat sink assembly as set forth in claim 8 wherein the lead protector includes means for inhibiting the base member from inadvertently moving from said first position to said second position.

10. A heat sink assembly for transistors that have bendable leads, comprising:
    a heat sink having a top, a bottom, and side walls, at least one of the side walls being adapted to receive a plurality of transistors such that the transistors' leads extend toward and beyond the bottom of the heat sink;
    a lead protector that has a base member with lead holes therein to receive leads from the transistors, the lead protector also having resilient detent means movably the heat sink such that, the base member is releasably held at a first predetermined position relative to the bottom of the heat sink, in which first position the transistor leads are received by the lead holes in the base member, thereby to protect the leads from inadvertent bending, and such that the base member is movable to a second predetermined position that is closer to the bottom of the heat sink in response to the base member being urged toward the heat sink.

11. A heat sink assembly as set forth in claim 10 wherein the base member includes means for inhibiting its inadvertent moving from the first position to the second position.

12. A heat sink assembly as set forth in claim 11 wherein the bottom of the heat sink carries a downwardly extending pin, wherein the base member has at least one hole therein to receive the pin, and wherein said inhibiting means includes a membrane positioned within the hole to stop the pin when the base member is in the first position.

13. A heat sink assembly as set forth in claim 12 for attachment to a circuit board having at least one hole therein, wherein the base member carries a downwardly extending, expandable foot that is at least partially hollow and that mates with the hole in the circuit board to attach the base member to the circuit board, and wherein the heat sink includes a pin extending from the bottom thereof such that the pin extends into the foot and expands it.

14. A heat sink assembly as set forth in claim 10 wherein the transistor leads are received by the lead holes in the base member but do not extend through and beyond the lead holes when the base member is in the first position, and wherein the transistor leads extend through and beyond the lead holes when the base member is in the second position.

15. A heat sink assembly as set forth in claim 10 including a spring clip for each transistor, each spring clip having a pair of legs for holding the transistors against a side wall of the heat sink, wherein the heat sink includes a pair of spaced-apart ramp surfaces situated immediately above each transistor to receive and spread apart the legs of each spring clip as each spring clip is being mated with the heat sink.

16. A heat sink assembly as set forth in claim 15 wherein each spring clip has a leg which has a relatively wide portion and a relatively narrow portion, the width of the legs being selected such that the relatively wide portion bears on the spaced-apart ramp surfaces to permit the legs to be spread apart, and the relatively narrow portion slips between the ramp surfaces to cause the legs to snap back from their spread-apart condition.

17. A heat sink assembly as set forth in claim 16 wherein the base member includes at least one alignment hole, wherein the bottom of the heat sink has at least one downwardly extending pin to be received by the alignment hole, and wherein a membrane is included within the alignment hole and positioned therein such that the pin bears on the membrane when the base member is in the first position, the base member being moveable to the second position when the pin penetrates the membrane.

18. A heat sink assembly for holding a plurality of transistors that have bendable leads, comprising:
a heat sink having a top, a bottom, side walls and a pair of end walls, both side walls being adapted to receive a plurality of transistors mounted thereon at a plurality of transistor sites such hat the transistors' leads extend toward and beyond the bottom of the heat sink;
the heat sink having a plurality of pairs of spaced-apart ramp surfaces located on the side walls, a pair of ramp surfaces being located immediately above each transistor site;
a plurality of spring clips, one for each transistor, each spring clip having a pair of legs for holding a transistor against a side wall of the heat sink, at least one of the legs of each spring clip having a relatively wide portion that bears on a pair of ramp surfaces that spread apart the legs of the spring clip as the spring clip is being mated with the heat sink, and a relatively narrower portion that slips between the spaced-apart ramp surfaces to permit the spread-apart legs to snap back and hold a transistor against the heat sink;
a lead protector having a base member with lead holes therein, the lead protector having a pair of upwardly extending arms that engage the end walls of the heat sink to position the base member closely adjacent the bottom of the heat sink, the arms being moveable between a first discrete position in which the transistor leads are received by the lead holes so as to protect the leads from inadvertent bending, and a second discrete position in which the transistor leads extend through the lead holes.

* * * * *

UNITED STATES PATENT AND TRADEMARK OFFICE
CERTIFICATE OF CORRECTION

PATENT NO. : 4,872,089
DATED : October 3, 1989
INVENTOR(S) : Ocken et al.

It is certified that error appears in the above-identified patent and that said Letters Patent is hereby corrected as shown below:

Claim 10: Col. 8, line 43, between "movably" and "the heat", insert:

attaching the lead protector to

Signed and Sealed this

Eleventh Day of September, 1990

Attest:

HARRY F. MANBECK, JR.

Attesting Officer

Commissioner of Patents and Trademarks